United States Patent [19]

Shinoda

[11] Patent Number: 5,055,072

[45] Date of Patent: Oct. 8, 1991

[54] PRESS-FIT CONTACT PIN

[75] Inventor: Kei-ichi Shinoda, Tokyo, Japan

[73] Assignee: Minnesota Mining and Manufacturing Company, St. Paul, Minn.

[21] Appl. No.: 583,650

[22] Filed: Sep. 17, 1990

[30] Foreign Application Priority Data

Oct. 13, 1989 [JP] Japan ................................. 1-267982

[51] Int. Cl.⁵ ............................................ H01R 13/42
[52] U.S. Cl. ...................................... 439/751; 439/84
[58] Field of Search .................... 439/83, 84, 751, 873

[56] References Cited

U.S. PATENT DOCUMENTS

| | | | |
|---|---|---|---|
| 4,274,699 | 6/1981 | Keim ............................... | 439/751 X |
| 4,533,204 | 8/1985 | Moynagh et al. ................... | 439/751 |
| 4,606,589 | 8/1986 | Elsbree et al. .................... | 439/751 X |
| 4,759,721 | 7/1988 | Moore ............................. | 439/751 X |

Primary Examiner—Eugene F. Desmond
Attorney, Agent, or Firm—Gary L. Griswold; Walter N. Kirn; John C. Barnes

[57] ABSTRACT

Press fit pins for use with printed circuit board substrates must maintain pressure with through holes of wide displacement range and a pin with symmetrical mounting portions, each with an arm to engage the inner periphery of the opposite portion elastically, increases range of permissible fabrication deviation.

4 Claims, 4 Drawing Sheets

PRESS-FIT CONTACT PIN

BACKGROUND OF THE INVENTION

1. Field of the Invention

The present invention relates to an electric contact pin, and in particular, to a press-fit contact pin which is inserted into a through hole of a printed substrate (circuit board) and secured thereto.

2. Description of the Prior Art

Conventional press-fit contact pins are disclosed for example, in Japanese Patent Publication No. 58-41633 and in Japanese patent application no. 59-54120 (unexamined).

In this field of art, the diameter of through holes formed in a printed circuit board substrate is very small due to a high density of parts on the substrate. If a conventional press-fit contact pin is scaled down with the shape thereof maintained as it is, the cross-sectional area of the contact pin becomes very small, and accordingly, it becomes difficult for the contact pin to be applied with even the minimum load required for assuring a good electrical and mechanical contact when the pin is inserted into the through hole.

The above-mentioned through hole is usually plated with copper or the like, and it can not be avoided to allow some amount of tolerance of the through hole diameter in fabrication. Therefore, the contact pin is desired to maintain a pressing load above the above-mentioned minimum load even in case various fabricational deviations are caused. Especially, at the present time when the diameter of the through holes have become very small and the influence of the tolerance deviation is relatively great, it is strongly desired that a wide range of the fabricational deviation can be permitted for assuring a good contact.

SUMMARY OF THE INVENTION

The present invention provides a press-fit contact pin which can be suitably applied to a printed substrate having small-diameter through holes and can maintain a good contact in a wide range of the fabricational deviation of the hole diameter.

A press-fit contact pin according to the present invention comprises a mounting portion which is made of an electrical conductor and inserted into a through hole formed in a printed circuit board substrate or the like, and end portions which are made of an electrical conductor and connected with respective longitudinally opposite sides of the mounting portion. The mounting portion has two body portions extending in a longitudinal direction of the mounting portion. Each of the body portions has an arm, and the mounting portion has a symmetrical shape in a cross-section about a line perpendicular to the longitudinal axis of the mounting portion. When the mounting portion is inserted into the through hole and the body portions contact with the inner surface of the through hole, a press force is exerted on the body portions from the inner surface of the through hole, and each of the body portions is so displaced that an end of the arm of one body portion approaches the inner peripheral surface of the other body portion. The body portions are effectively preferred to be so constructed that, when the body portions suffer greater displacements, the end of the arm of said one body portion comes into contact with the inner peripheral surface of the other body portion and presses elastically the inner peripheral surface of the other body portion.

It is also possible to connect the ends of the two arms with each other. In this case, when the mounting portion is inserted into the through hole and the body portion comes into contact with the inner surface of the through hole, the press force from the inner surface to the body portion compels a deformation of the mounting portion, and finally cuts down the connecting portion of the arms, thereby producing the same effect as in the before-mentioned case.

It is effective that the body portion has a transverse sectional shape similar to a longitudinal sectional shape of a golf club head.

Further, it is helpful to provide a flange projecting perpendicularly to the pin axis at one of the two end portions.

When a contact pin constructed as mentioned above is inserted into a through hole of a printed circuit board substrate, a press force is exerted from the inner surface of the through hole onto the body portions and displaces ends of the arms of the body portions from the central portion of the mounting portion towards the periphery of the same, thereby shifting each body portion towards the center of the through hole. When the press force increases, the tip of the arm of one body portion comes into contact with the inner peripheral surface of the other body portion and the arm is elastically bent.

Since the cross-section of the body portion has a shape similar to that of the longitudinal cross section of a golf club head, one body portion can shift in a rather greater range without contacting the inner peripheral surface of the other body portion, when the body portion receives a load greater than the minimum one, and further, even when the end of the arm comes into contact with the inner peripheral surface, the possible displacement range of the body portion can be further increased by virtue of the flexibility of the arm.

The flange extending perpendicularly to the pin axis at one of the end portions serves to provide a stopping engagement between the lower surface of the flange and the printed circuit board substrate, when the pin is inserted into the through hole.

BRIEF DESCRIPTION OF THE DRAWINGS

The present invention will be more fully described with reference to the accompanying drawing wherein.

DESCRIPTION OF THE PRESENTLY PREFERRED EMBODIMENT

Referring to the attached drawings, preferred embodiments of the present invention will be described below.

Figure 1:
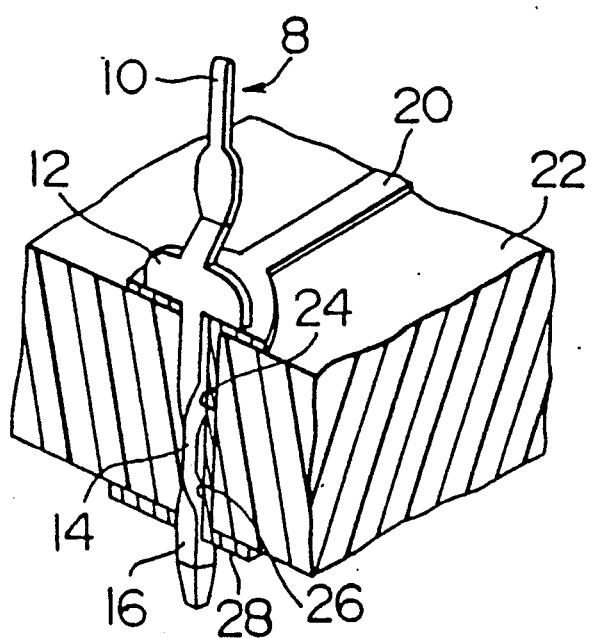
FIG. 1 is a fragmentary sectional view of a printed circuit board substrate with a contact pin according to the present invention inserted through a through hole of the substrate.

FIG. 1 shows a first embodiment of the present invention, wherein a press-fit contact pin 8 is inserted into and secured to a through hole 24 of a printed circuit board substrate 22.

The printed substrate shown in section in FIG. 1 is a plate made of a glass epoxy material and adhered with copper foil on the both sides of the plate for forming conductor pads 20, 28. Further, the inner surface of through hole 24 is formed with a gilt with copper or other conductive metal. The diameter of the through hole is about 0.6 mm.

The integrally formed contact pin 8 has a flange 12, above and below the flange are arranged an upper end portion 10 and a lower end mounting portion 16, respectively. The lower end portion 16 has mounting portions 14 at its substantially middle position, which engage with the inner surface 26 of the through hole 24 when the pin is inserted into the through hole of the printed substrate. The flange 12 extends from the pin on a plane perpendicular to the pin axis, and serves as a stopping means for positioning the contact pin in the printed substrate with a certain depth. The lower edge of the flange 12 is adapted to closely contact with a conductor pad of the printed substrate.

Figures 2, 3:
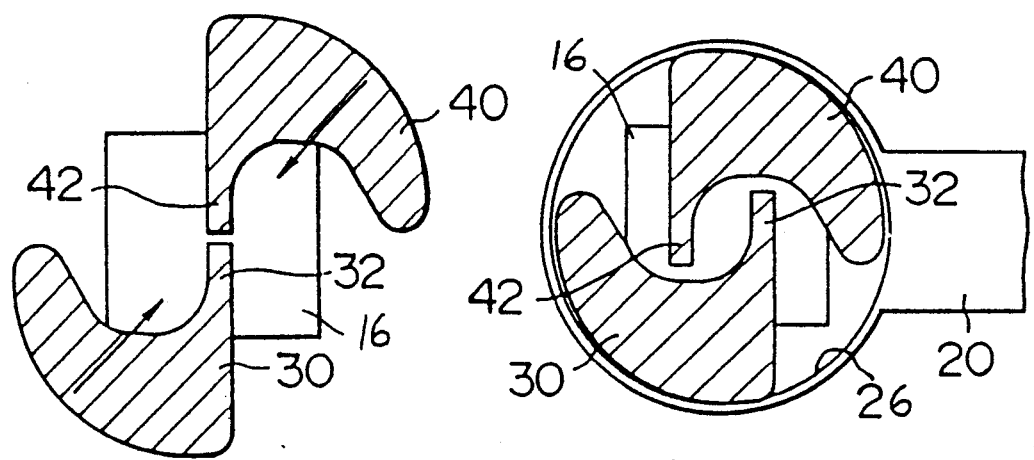
FIG. 2 is a cross-sectional view of a mounting portion according to the present invention.
FIGS. 3 and 4 are cross-sectional views of the contact pin shown in FIG. 2 inserted into a through hole.

As shown in FIG. 2, the mounting portion 14 of the pin 8 is divided into two body portions which are symmetrical in cross section about a line perpendicular to the pin axis and identified as portions 30, 40 which have arms 32, 42, respectively. In the embodiment shown in FIG. 2, the cross-section of each body portion has a shape similar to that of a longitudinal cross-section of a golf club head, i.e. it has a bulbous cross-sectional portion having a convex external surface and a concave inner surface and the portion widens near one end, from which projects the arm, generally radially to the convex curved outer surface.

Viewed in section, each arm extends from an end of the body portion radially inwardly towards the center of the mounting portion, and the two arms are separated from each other.

When the pin is inserted into the through hole of the printed substrate, the press force is exerted on each of the body portions in a direction (radially inward) indicated with an arrow in FIG. 2, and the mounting portion is deformed so that the body portions are disposed and approach each other and the diameter of the mounting portion is decreased, as shown in FIG. 3. In this situation, there is formed another point symmetrical sectional shape of the mounting portion 14, where each arm extends from the central portion towards the peripheral portion, and each of the body portions closely contact with the inner surface of the through hole, thereby assuring a good conductibility.

Figure 4:
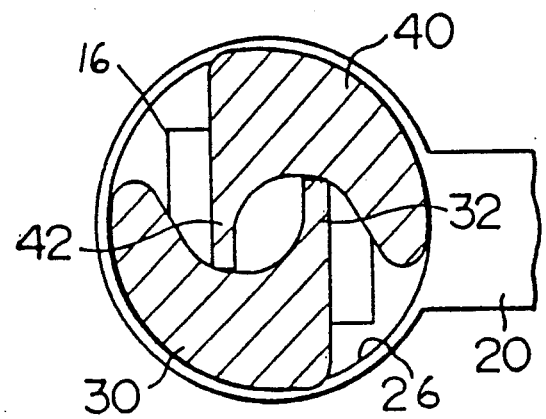

When the inner diameter of the through hole is small and the press force acting on the pin increases due to a further insertion of the pin, the body portions come into contact with each other at the arms 32, 42 as shown in FIG. 4. When the press force becomes even greater, the mounting portion slightly sinks into the inner surface 26 of the through hole 24 and the arms 32, 42 of the body portions are elastically bent. As a result, in a wide range of the body portion displacements, a necessary contact load can be maintained and an excellent electrical and mechanical contact between the pin 8 and the inner surface of the through hole can be obtained.

Figure 10:
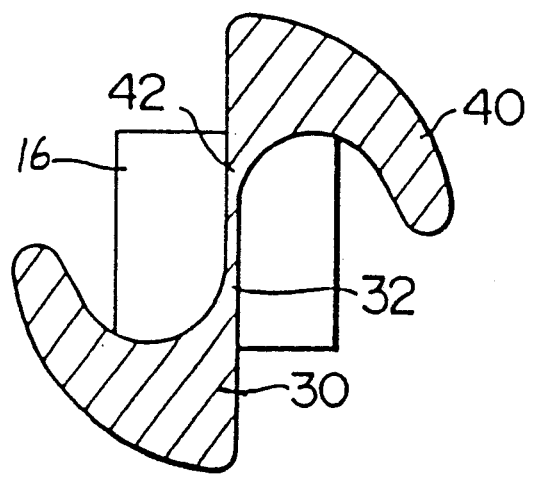
FIG. 10 is a cross-sectional view of a mounting portion according to a second embodiment of a contact pin of the present invention.

FIG. 10 shows a second embodiment of the present invention, wherein the mounting portion is so constructed that the arms of the body portions are connected with each other. In this embodiment, when the pin is inserted into the through hole and the mounting portion comes into contact with the inner surface of the through hole and receives an increasing press force, the connecting portion of the arms is broken, and, similarly to the first embodiment, the tip of the arm of each body portion is disposed and approaches the inner surface of the other body portion and comes into contact with the same when the press force increases beyond a certain level. When the press force further increases, the arms function in the same way as in the first embodiment.

Figure 5A:
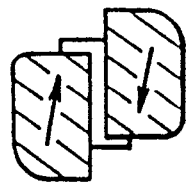
FIG. 5A is a cross-sectional view of a mounting portion of a conventional contact pin.
Figure 5B:
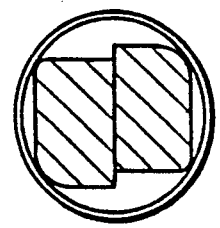
FIG. 5B is a cross-sectional view of the contact pin shown in FIG. 5A inserted into a through hole.
Figure 6A:
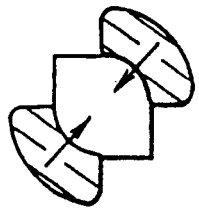
FIG. 6A is a cross-sectional view of a mounting portion of another conventional contact pin.
Figure 6B:
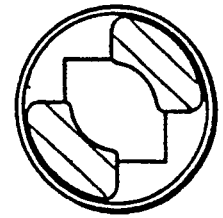
FIG. 6B is a cross-sectional view of the contact pin shown in FIG. 6A inserted into a through hole.

Conventional press-fit contact pins of two types are shown in FIGS. 5A and 6A in their cross-sections. When these pins are inserted into a through hole of a printed substrate, the cross-sectional shapes of the mounting portions are deformed as shown in FIGS. 5B and 6B, respectively.

Figure 7:
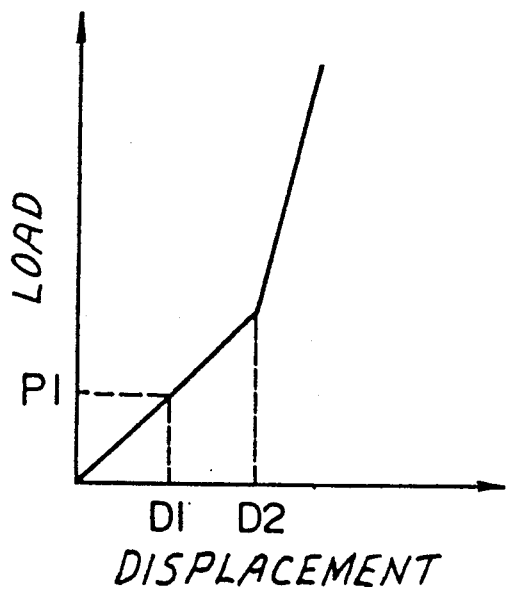
FIGS. 7 to 9 are graphs indicating relationships between loads and displacements of body portions in a conventional contact pin, in another conventional contact pin and in a contact pin according to the present invention, respectively.
Figure 8:
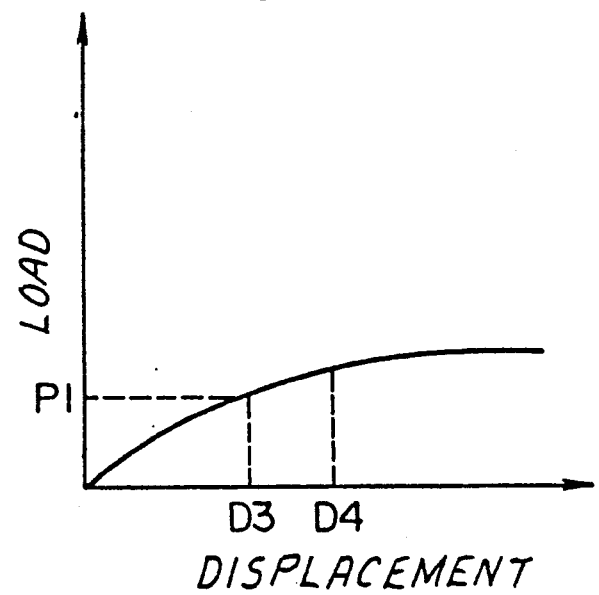

FIGS. 7 and 8 show graphs, each of which indicates a relationship between a load acting on a mounting portion or on the inner surface of a through hole and a displacement of the body portion, when each of the conventional contact pins is inserted into a through hole.

In order to achieve a good contact between a mounting portion of a contact pin and an inner surface of a through hole, a load is required as great as at least P1 indicated in the Figures.

P1 means a minimum value required for assuring a good electrical and mechanical contact, and is determined by the inner diameter of the through hole, the outer diameter of the pin before the pin is inserted into the through hole, and the modulus of elasticity of the contact pin.

In example 1, of a prior art contact pin as shown in FIG. 7, the displacement D1 is caused when a minimum load P1 is applied. When the load increases and the displacement becomes D2, some portions of the mounting portion come into contact with each other. As a consequence, when the load further increases, the through hole is damaged. Accordingly, the possible displacement range D1–D2 is narrow, and it is difficult for the pin to obtain a good contact in a printed substrate having through holes of small diameter.

In example 2 of a prior art contact pin shown in FIG. 8, the possible displacement range is rather large. However, when the absolute values of the load and the displacement increase, the deformation of the mounting portion does not remain in an elastic range, but reaches a plastic range, where the elasticity of the mounting portion is lost and the good contact of the mounting portion with the inner surface of the through hole can not be maintained.

Figure 9:
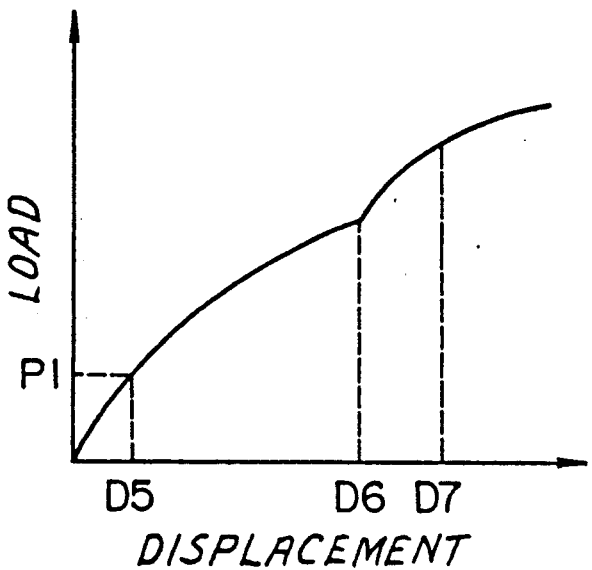

On the other hand, in a contact pin according to the present invention, as shown in FIG. 9, the possible displacement range D5-D6 is sufficiently wide. Further, at the displacement D6, the arm of one body portion comes into contact with the other body portion and starts an elastic deformation, and at the displacement D7, the elasticity of the mounting portion is still maintained. In other words, a wide displacement range D5-D7 can be obtained by a contact pin according to the present invention. Therefore, it is clear that a press-fit contact pin according to the present invention is suitably applied to a through hole of small diameter.

Figures 11, 12:
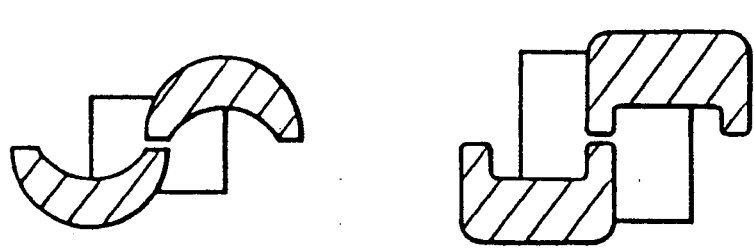
FIGS. 11 and 12 are cross-sectional views of mounting portions according to further embodiments of the present invention.

In FIGS. 11 and 12, cross-sectional views of contact pins according to other embodiments are shown.

By virtue of the arrangement according to the present invention, there is obtained a good electrical and mechanical contact of a press-fit contact pin in a conventional printed substrate having small through holes as well as in a printed substrate having much smaller through holes due to a high density equipment.

Further, by providing a flange, when a pin is inserted into a through hole of a printed substrate, the depth of the pin can be precisely determined.

I claim:

1. A press-fit contact pin comprising a mounting portion which is inserted into a through hole having an inner wall, mounted on a printed circuit board substrate, said mounting portion having end portions connected on respective opposite sides of said mounting portion in a longitudinal direction thereof, and said pin being formed of an electrically conductive material, said mounting portion having two body portions extending longitudinally therefrom, each of said body portions having an arm, said body portions forming said mounting portion being disposed to form a symmetrical shape in cross section about a line normal to a longitudinal axis thereof, a press force exerted on said body portions by a said inner wall compels a displacement to occur between said body portions, to make an end of said arm of one of said body portions become intimate with an inner periphery of the other of said body portions, when said mounting portion is inserted into a said through hole and said body portions come into contact with an inner wall of a said through hole, and said end of said arm comes into contact with said inner periphery and presses elastically against said inner periphery when said press force compels a further displacement to occur between said body portions.

2. A press-fit contact pin according to claim 1, wherein said ends of said arms are formed so as to connect with each other and to be separated from each other by compelling a discrepancy to occur between said body portions when said mounting portion is inserted into the through hole and said body portions come into contact with said inner wall of the through hole.

3. A press-fit contact pin according to claim 1, wherein a transverse section of said mounting portion comprises a bulbous portion having a convex external surface for engaging the inner wall of a said through hole and a concave inner surface, the bulbous portion widens at one end and an arm extends from said one end generally radially to said external surface.

4. A press-fit contact pin according to claim 1, wherein said pin includes an upper end portion and has a flange between said upper end portion and said mounting portion extending therefrom in a direction normal to the axial direction of said pin.

* * * * *